United States Patent
Jang

(10) Patent No.: US 8,860,175 B2
(45) Date of Patent: Oct. 14, 2014

(54) FUSE OF SEMICONDUCTOR DEVICE AND METHOD FOR FORMING THE SAME

(71) Applicant: SK hynix Inc., Icheon-si (KR)

(72) Inventor: Chi Hwan Jang, Icheon-si (KR)

(73) Assignee: SK hynix Inc., Icheon (KR)

(*) Notice: Subject to any disclaimer, the term of this patent is extended or adjusted under 35 U.S.C. 154(b) by 24 days.

(21) Appl. No.: 13/718,940

(22) Filed: Dec. 18, 2012

(65) Prior Publication Data
US 2014/0008759 A1    Jan. 9, 2014

(30) Foreign Application Priority Data
Jul. 9, 2012 (KR) .................. 10-2012-0074575

(51) Int. Cl.
H01L 23/52 (2006.01)
H01L 21/768 (2006.01)
H01L 23/62 (2006.01)

(52) U.S. Cl.
CPC .............. H01L 23/62 (2013.01); H01L 21/768 (2013.01)
USPC .............. 257/529; 257/209; 257/E23.146; 257/E23.149

(58) Field of Classification Search
USPC .................. 257/209, 529, E23.146, E23.149, 257/E21.592, E21.595, E21.596
See application file for complete search history.

(56) References Cited

U.S. PATENT DOCUMENTS

| | | | |
|---|---|---|---|
| 6,713,837 B1* | 3/2004 | Mori et al. ................ | 257/529 |
| 6,972,474 B2* | 12/2005 | Hashimoto ................ | 257/529 |
| 2007/0115745 A1* | 5/2007 | Byun et al. ................ | 365/225.7 |
| 2007/0122945 A1* | 5/2007 | Kim ................ | 438/132 |
| 2010/0123212 A1* | 5/2010 | Chung et al. ................ | 257/529 |

FOREIGN PATENT DOCUMENTS

| | | |
|---|---|---|
| KR | 1020080008046 A | 1/2008 |
| KR | 1020100023267 A | 3/2010 |

* cited by examiner

*Primary Examiner* — Eduardo A Rodela

(57) ABSTRACT

A fuse of a semiconductor device and a method for forming the same are disclosed. The fuse includes a first metal line formed over a semiconductor substrate, a second metal line spaced apart from the first metal line, and a contact fuses formed of a metal contact coupled to the first metal line and the second metal line. Upper parts of the contact fuses overlap with each other, and lower parts are spaced apart from each other. Since the fuse is formed of a metal contact, fuse oxidation and fuse movement can be prevented. A conventional metal-contact fabrication process can be used, so that mass production of semiconductor devices is possible. In addition, the fuse region is reduced in size, reducing production costs.

17 Claims, 7 Drawing Sheets

FUSE OF SEMICONDUCTOR DEVICE AND METHOD FOR FORMING THE SAME

CROSS-REFERENCE TO RELATED APPLICATION

The priority of Korean patent application No. 10-2012-0074575 filed on 9 Jul. 2012, the disclosure of which is hereby incorporated in its entirety by reference, is claimed.

BACKGROUND OF THE INVENTION

Embodiments of the present invention relate to a fuse of a semiconductor device and a method for forming the same, and more particularly to a fuse of a semiconductor device using a metal contact, and a method for forming the same.

Numerous memory cells capable of storing data are contained in a semiconductor device, such as a memory device or a memory merged logic (MML). However, if any one of the memory cells contained in a semiconductor device is determined to be a defective or a failed memory cell, the whole memory device becomes a defective product, resulting in reduction in production yield. That is, although the failure occurs only in some cells of the semiconductor device, the entire semiconductor memory device is discarded as a defective product, resulting in far less efficiency in terms of production yield. In order to guarantee the high production yield of a memory device or a semiconductor device including memory cells, a repair function is needed. In accordance with a repair process for a semiconductor device, a defective memory cell is replaced with a redundancy memory cell. In order to replace a defective memory cell with a redundancy memory cell, a fuse is used. Therefore, a plurality of fuses is contained in the semiconductor device, and the fuses can be blown (or severed) by a laser spot. In addition, fuses can be selectively removed according to a test result of the semiconductor device.

In a repair method using a redundancy cell, a redundancy word line, which substitutes for a normal word line, and a redundancy bit line, which substitutes for a normal bit line, are pre-installed per cell array. That is, if a defective or a failed part is found in a specific cell, a normal word line including the failed part or a normal bit line including the failed part can be replaced with a redundancy word line or a redundancy bit line. For this purpose, the memory device includes a specific circuit configured to replace an address assigned to the defective cell with an address assigned to the redundancy cell. Therefore, by using the above-mentioned repair method based on a redundancy cell, if an address signal corresponding to the defective cell is input, the redundancy cell is activated instead of the defective cell.

A popular repair method replaces an original address path with a substitute path by burning off the fuse coupled to the original address path with laser spots. Therefore, a typical memory device includes a fuse unit that is designed to be cut by a laser spot. In the fuse unit, a portion to be blown by a laser spot is referred to as a fuse, and a portion surrounding the fuse is referred to as a fuse box.

A typical fuse is generally formed as a line-type metal line. A fuse formed of aluminum is vulnerable to oxidation and shows a poor contact characteristic. A Cu fuse is generally formed by a damascene process. However, when Cu is subjected to a damascene process, it tends to migrate into another device element, causing an electrical short.

The area occupied by a fuse in a semiconductor device is relatively large in size when the fuse is formed in a line type. In order to reduce the area occupied by the fuse, fuse length may be shortened. In that case, however, when the target fuse is cut, a neighboring fuse is likely to be damaged as well, resulting in a failed or defective semiconductor memory product. Thus, it is difficult to reduce the size of a fuse in a line type to successfully perform the conventional repair method.

BRIEF SUMMARY OF THE INVENTION

Various embodiments of the present invention are directed to providing a fuse of a semiconductor device and a method for forming the same that substantially obviate one or more problems due to limitations and disadvantages of the related art.

An embodiment of the present invention relates to a fuse of a semiconductor device and a method for manufacturing the same which can solve the problems encountered when a fuse is formed of a line-type metal wire. That is, the embodiment of the present invention can solve the problem in which it is difficult to reduce the size of a fuse region, the problem in which a metal line is oxidized and damaged, and the problem in which reliability of the semiconductor device is deteriorated because of movement of a metal line after the fuse cutting.

In accordance with an aspect of the present invention, a fuse for a semiconductor device includes: a first metal line formed over a semiconductor substrate, and a second metal line spaced apart from the first metal line, and a dummy line disposed between the first metal and the second metal line; and contact fuses including metal contacts coupled to the first metal line and the second metal line, wherein upper parts of the contact fuses overlap with each other, and lower parts are spaced apart from each other.

The contact fuses may be comprised of at least two metal contacts.

The contact fuses may include at least three metal contacts, and wherein an upper portions of the metal contacts overlap with each other and are arranged in a triangle configuration.

The metal contact may be formed of any one of tungsten (W), titanium (Ti), titanium nitride (TiN), copper (Cu), tantalum (Ta), tantalum nitride (TaN), silicon (Si), and cobalt (Co).

The contact fuses may be spaced apart neighboring contact fuses and arranged in a linear manner with respect to neighboring contact fuses.

The contact fuses may be spaced apart neighboring contact fuses and arranged in a zigzag manner with respect to neighboring contact fuses.

The first metal line may be configured to receive a voltage for operating the contact fuses as an input.

The dummy line may be used as an etch stop film.

In accordance with another aspect of the present invention, a method for forming a semiconductor device includes forming a first metal line, a second metal line spaced apart from the first metal line and a dummy line between the first metal line and the second metal line over a semiconductor substrate; forming an interlayer insulation film over the semiconductor substrate including the first metal line, the second metal line and the dummy line; forming a metal contact holes that pass through the interlayer insulation film and exposes the first metal line, the second metal line and the dummy line; and forming contact fuses filling a metal material in the metal contact holes, wherein an upper parts of the contact fuses overlap with each other and lower parts are spaced apart from each other.

The contact fuses may be comprised of at least two metal contacts.

The contact fuses may be comprised of at least three metal contacts, and wherein the metal contacts are arranged in a triangle configuration.

The metal contact may be formed of any one of tungsten (W), titanium (Ti), titanium nitride (TiN), copper (Cu), tantalum (Ta), tantalum nitride (TaN), silicon (Si), and cobalt (Co).

The contact fuses and neighboring contact fuses may be spaced apart from each other and arranged in a linear manner.

The contact fuses and neighboring contact fuses may be spaced apart from each other and arranged in a zigzag manner.

The first metal line may receive a voltage for operating the contact fuses as an input.

The dummy line may be used as an etch stop film.

The method may further include: after forming the contact fuses, forming an insulation film over the interlayer insulation film; and forming a fuse-open region by etching the insulation film until the contact fuses are exposed.

The method may further include: prior to the formation of the insulation film over the interlayer insulation film, forming an insulation film pattern over the interlayer insulation film; and forming a damascene insulation film over the insulation film pattern.

The method may further include: after forming the fuse-open region, performing fuse blowing by applying a laser spot to the contact fuses. When performing the fuse blowing, upper parts of the contact fuses may be removed, and an interlayer insulation film disposed between the removed contact fuses may remain so that a barrier is formed. In accordance with other aspect of the present invention, a fuse for a semiconductor device includes: contact fuses comprising a first metal contact, a second metal contact and a third metal contact; first and second metal lines coupled to the first and the third metal contacts, respectively; a dummy line coupled to the second metal contact and insulated from the first and the second metal lines wherein the contact fuse vertically extends from the dummy line.

The second metal contact is arranged in a triangle configuration with respect to the first metal contact and the third metal contact.

Wherein the contact fuses are arranged in a linear manner or in a zigzag manner with respect to the neighboring contact fuses.

An upper portion of the second metal contact may be coupled to upper portions of the first and the third metal contacts, respectively, and wherein a lower portion of the second metal contact may be insulated from lower portions of the first and the third metal contacts, respectively.

An upper surface of the first metal line and an upper surface of the dummy line are disposed at a first level, wherein an upper surface of the first, the second and the third metal contacts fuses are disposed at a second level higher than the first level.

In accordance with other aspect of the present invention, a fuse for a semiconductor device includes: contact fuses comprising a first metal contact, a second metal contact and a third metal contact; wherein an upper portion of the second metal contact is coupled to upper portions of the first and the third metal contacts, respectively, and wherein a lower portion of the second metal contact is insulated from lower portions of the first and the third metal contacts, respectively.

The device further may comprise first and second metal lines coupled to lower portions of the first and the third metal contacts, respectively, and a dummy line coupled to a lower portion of the second metal contact and insulated from the first and the second metal lines, respectively.

The second metal contact is arranged in a triangle configuration with respect to the first metal contact and the third metal contact.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1A:
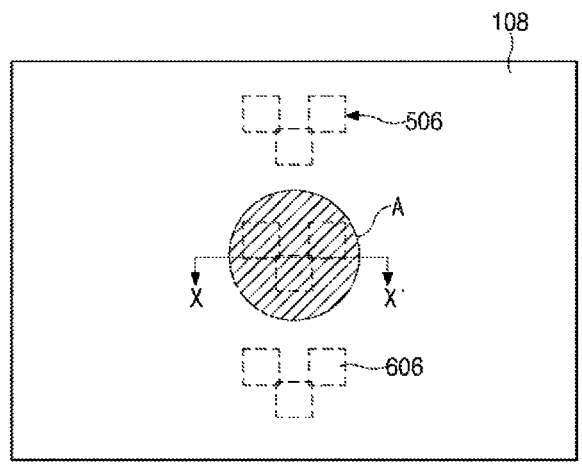
FIG. 1A is a plan view illustrating a fuse for use in a semiconductor device according to an embodiment of the present invention.
Figure 1B:
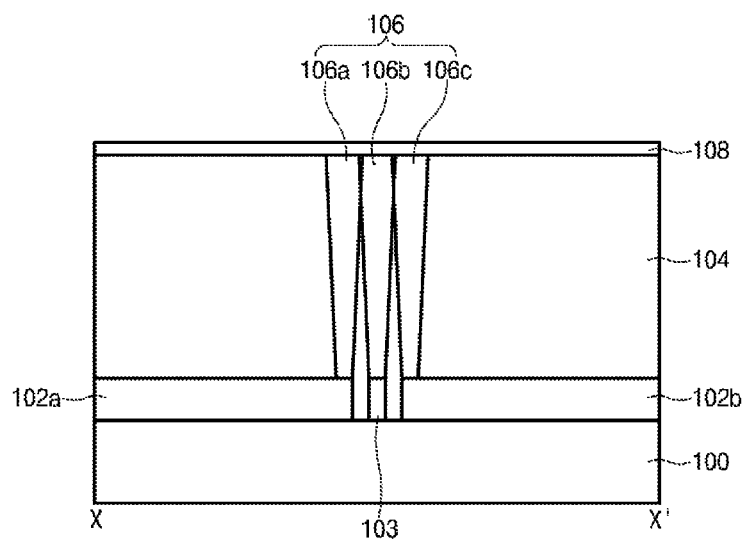
FIG. 1B is a cross-sectional view illustrating a fuse of a semiconductor device according to an embodiment of the present invention taken along the line X-X' of FIG. 1A.

FIG. 1A is a plan view illustrating a fuse for use in a semiconductor device according to a first embodiment of the present invention. FIG. 1B is a cross-sectional view illustrating a fuse of a semiconductor device taken along the line X-X' of FIG. 1A according to a first embodiment of the present invention.

Referring to FIG. 1A, a contact fuses 106 includes three metal contacts, and the three metal contacts are arranged in a triangle pattern in a plan view. The upper portions of the three metal contacts may partly overlap with each other to be coupled to each other.

Generally, since a laser spot applied to the fuse during a fuse blowing process radiates a spot in the shape of a circle, a metal contact arranged in a triangle pattern can be easily covered by a single, small laser spot in a blowing process. The laser spot applied to the fuse is denoted 'A' in FIG. 1A. However, the scope or spirit of the present invention is not limited only to the triangle configuration, and the present invention can also be applied to other arrangements in which at least two metal contacts can overlap with each other. The metal contact may each be formed of any of tungsten (W), titanium (Ti), titanium nitride (TiN), copper (Cu), tantalum (Ta), tantalum nitride (TaN), silicon (Si), and cobalt (Co).

Referring to FIG. 1B, a first metal line 102a, a second metal line 102b and a dummy line 103 are formed over the semiconductor substrate 100. An interlayer insulation film 104 is formed over the first and the second metal lines 102a, 102b and the dummy line 103. An upper portion of the contact fuses 106 passing through the interlayer insulation film 104 comprises a first metal contact 106a, a second metal contact 106b, a third metal contact 106c. The first metal contact 106a, the third metal contact 106c are coupled to the first and the second metal lines 102a, 102b, respectively. In addition, the second metal contact 106b, which is interconnected with the first and the third metal contacts 106a, 106c, is coupled to the dummy line 103. The dummy line 103 is used as an etch stop film for preventing a metal contact from being coupled to a lower part of the contact fuses 106.

Upper portions of the three metal contacts 106a, 106b, 106c are coupled to each other while lower portions of the three metal contacts are isolated from each other. For example, upper portions of the three metal contacts 106a, 106b, 106c may be formed wider than lower portions, respectively, such that the upper portions of the metal contacts are interconnected to each other. An insulation film 108 for preventing oxidation of the contact fuses 106 may further be formed over the contact fuses 106 and the interlayer insulation film 104.

Thus, an upper portion of the contact fuses 106 may overlap with the first and the third metal contacts 106a, 106c, respectively, so that the second metal contact 106b is coupled to the first and third metal contacts 106a, 106c, while lower portion of the second metal contact 106b is spaced apart from the first metal contact 106a and the third metal contact 106c.

Although the contact fuses 106 according to the first embodiment of the present invention includes three metal contacts, the scope and spirit of the present invention is not limited thereto. The present invention can also be applied to any configuration in which an upper portion of the contact fuses 106 overlaps with each other and while a lower portion of the contact fuses 106 is spaced apart from each other.

Figure 2A:
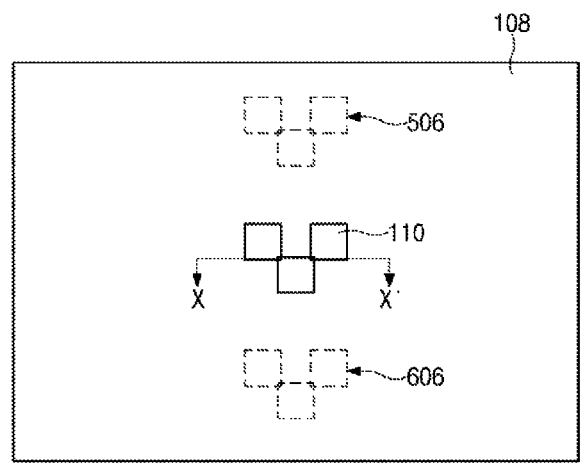
FIG. 2A is a plan view illustrating a fuse of a semiconductor device according to a first embodiment of the present invention.
Figure 2B:
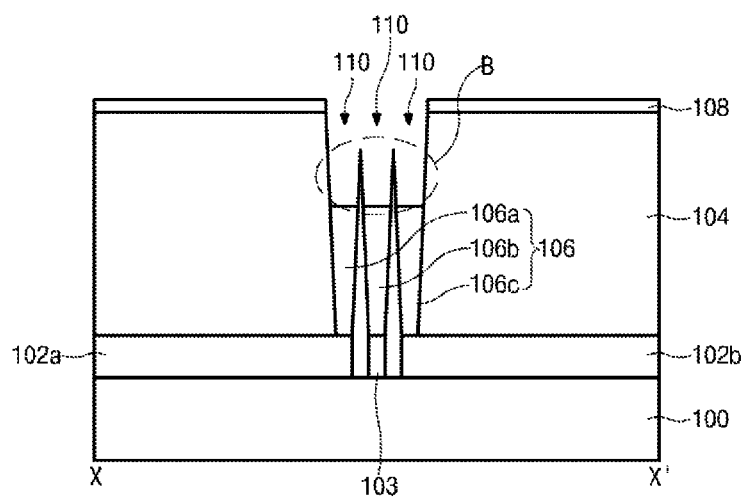
FIG. 2B is a cross-sectional view illustrating a fuse of a semiconductor device taken along the line X-X' of FIG. 2A after completion of a blowing process.

FIG. 2A is a plan view illustrating a fuse of a semiconductor device according to a first embodiment of the present invention after a fuse blowing process has been performed. FIG. 2B is a cross-sectional view illustrating a fuse of a semiconductor device taken along the line X-X' of FIG. 2A after completion of a blowing process.

Referring to FIG. 2A, a laser spot a laser spot is applied to the contact fuses 106 such that the blowing region 110 is formed. In this case, the contact fuses 106 include a metal contact arranged in a triangle configuration, such that it can be easily removed even by a small-sized spot size. Therefore, only a target fuse can be easily removed without affecting the contiguous contact fuses 506, 606.

Referring to FIG. 2B, a laser spot is applied to the contact fuses 106 to form the blowing region 110 over the first metal contact 106a, the second metal contact 106b and the third metal contact 106c. In addition, only the upper portion of the contact fuses 106 is removed, while an interlayer insulation film 104 provided between the contact fuses 106 is not removed, resulting in formation of a barrier B. In this case, the barrier B prevents the contact fuses 106 from being coupled to each other in a subsequent process, and increases reliability of the fuse. Upon completion of the blowing process, the first metal contact 106a is isolated from the third metal contact 106c. Accordingly, the first metal line 102a is isolated from the second metal line 102b.

Figure 3A:
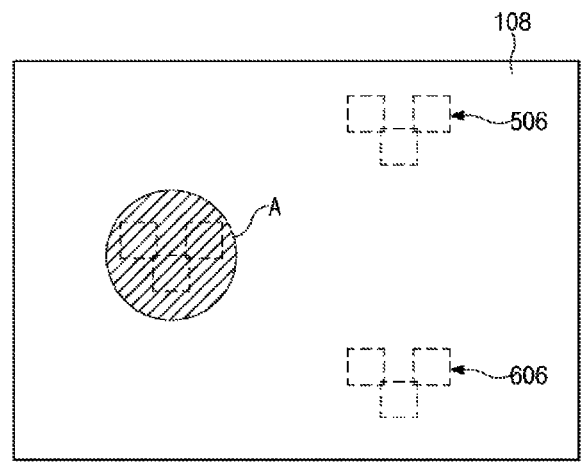
FIG. 3A is a plan view illustrating a fuse of a semiconductor device according to a second embodiment of the present invention.
Figure 3B:
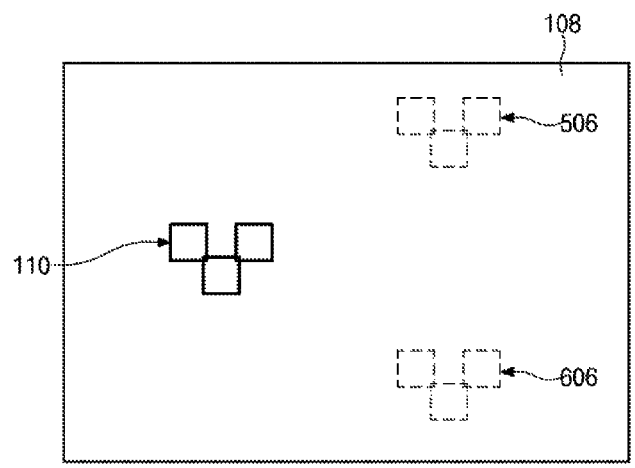
FIG. 3B is a plan view illustrating a semiconductor device after completion of a blowing process according to the second embodiment of the present invention.

FIG. 3A is a plan view illustrating a fuse of a semiconductor device according to a second embodiment of the present invention. FIG. 3B is a plan view illustrating a semiconductor device according to the second embodiment of the present invention after completion of the blowing process.

Referring to FIG. 3A, the contact fuses 106 according to the present invention may be arranged in a non-linear or zigzag pattern with respect to neighbor contact fuses 506, 606. In this case, the contact fuses 106 include three metal contacts arranged in the triangle configuration on a plan view.

Generally, since a laser spot applied to the contact fuses to be blown is shaped as a circle, a metal contact arranged in the triangle configuration, it can be covered by a smaller laser spot than when contact fuses 106 is in a linear configuration. Preferably, the laser spot applied to the contact fuses according to the present invention may have the size of A. However, the scope or spirit of the present invention is not limited only to the triangle configuration, and the present invention can also be applied to other arrangements in which at least two metal contacts can overlap with each other.

Referring to FIG. 3B, a laser spot is applied to the contact fuses 106 such that a blowing region 110 is formed. In an embodiment, since the contact fuses 106 is arranged in a zigzag manner with respect to the neighboring contact fuses 506, 606, the neighboring contact fuses 506, 606 are less likely to be damaged spot during a fuse blowing process applied to a target contact fuses, i.e., the contact fuses 106 in this embodiment.

Figure 4A:
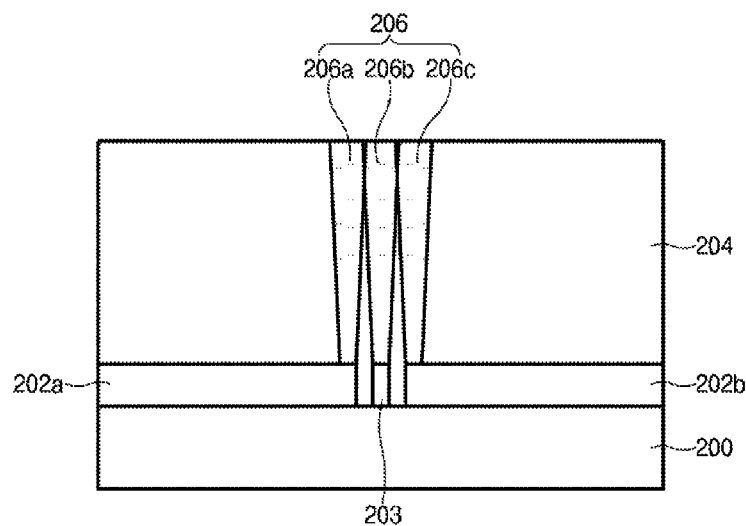
FIGS. 4A to 4C are cross-sectional views illustrating a method for forming a fuse of the semiconductor device according to a first embodiment of the present invention.
Figure 4B:
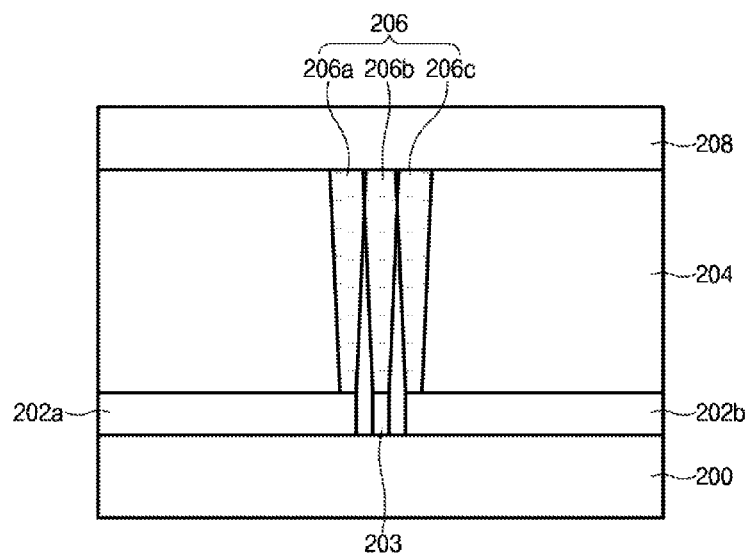
Figure 4C:
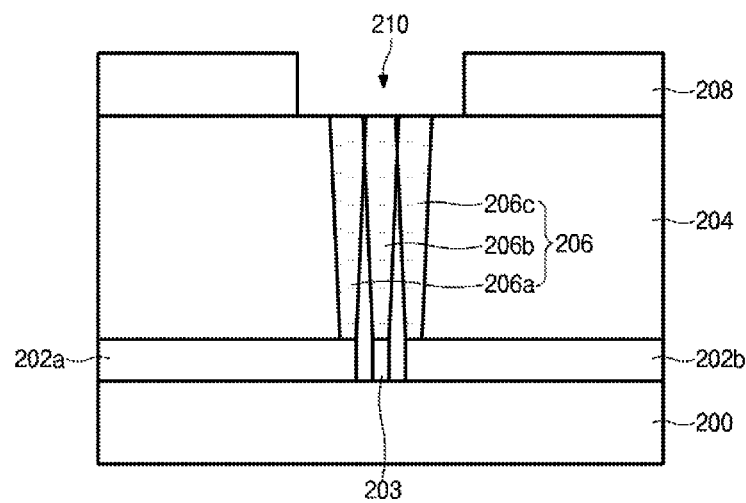

FIGS. 4A to 4C are cross-sectional views illustrating a method for forming a fuse of the semiconductor device according to a first embodiment of the present invention.

Referring to FIG. 4A, a first metal line 202a and a second metal line 202b are formed over a semiconductor substrate 200. The first metal line 202a and the second metal line 202b are patterned so that they are spaced apart from each other. A dummy line 203 is formed over the semiconductor substrate 200 and spaced apart from the first and the second metal lines 202a, 202b.

A voltage (Vss or Vdd) required for the fuse operation may be applied to the first metal line 202a, and the second metal line 202b is used as an etch stop film for preventing the metal contact from being extended to a lower part of the semiconductor device.

Subsequently, an interlayer insulation film 204 is formed over the semiconductor substrate 200 including the first and the second metal lines 202a, 202b and the dummy line 203. Then the interlayer insulation film 204 is etched to expose portions of the first and second metal lines 202a, 202b and the dummy line 203, such that a plurality of contact holes is formed. The contact holes expose the first the second metal lines 202a, 202b and the dummy line 203, respectively.

Subsequently, a metal material fills in the metal contact holes such that a first metal contact 206a, a second metal contact 206b, a third metal contact 206c are formed. A contact fuses comprises the three metal contact 206a, 206b, 206c.

Preferably, upper portions of the first metal contact 206a and the third contact 206c are coupled to an upper portion of the metal contact 206b. In contrast, lower portions of the first metal contact 206a and the third contact 206c are insulated from a lower portion of the second metal contact 206b. In addition, the three metal contacts 206a, 206b, 206c may be arranged in an inverted triangle configuration. The contact fuses 206 may be arranged in a linear manner or in a zigzag manner with respect to neighboring contact fuses, as shown in FIG. 1A or 3A. The metal contacts each may be formed of any of tungsten (W), titanium (Ti), titanium nitride (TiN), copper (Cu), tantalum (Ta), tantalum nitride (TaN), silicon (Si), and cobalt (Co).

Referring to FIG. 4B, an insulation film 208 is formed over the contact fuses 206. Although not shown in the drawings, an additional structure may be formed over the contact fuses.

Referring to FIG. 4C, the insulation film 208 is etched to expose the contact fuses 206, such that a fuse-open region 210 is formed. Although not shown in FIG. 4C, an additional process for blowing the contact fuses 206 by applying a laser spot to the fuse-open region 210 may also be performed in a subsequent process.

Figure 5A:
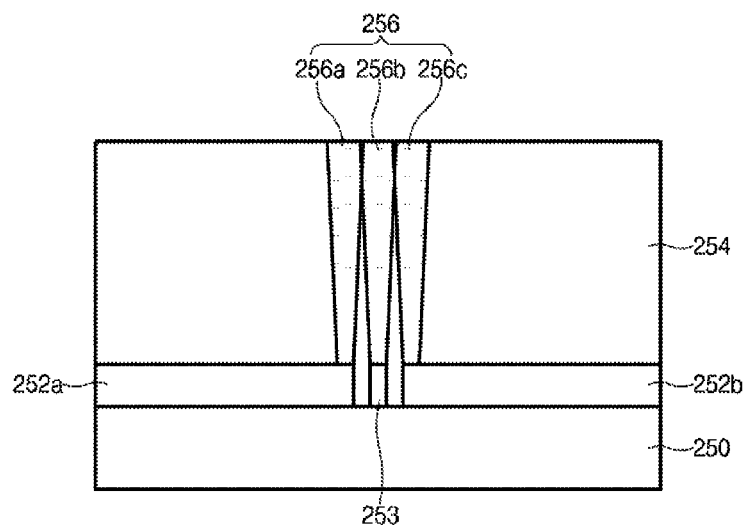
FIGS. 5A to 5C are cross-sectional views illustrating a method for forming a fuse of the semiconductor device according to a second embodiment of the present invention.
Figure 5B:
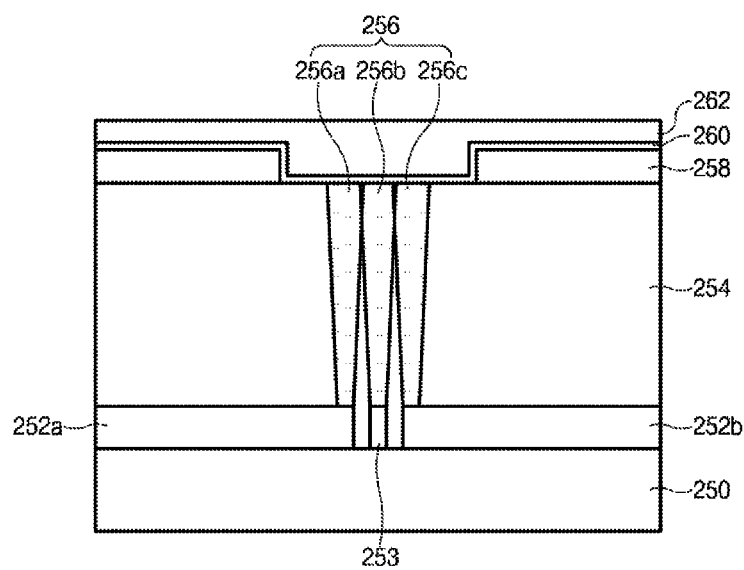
Figure 5C:
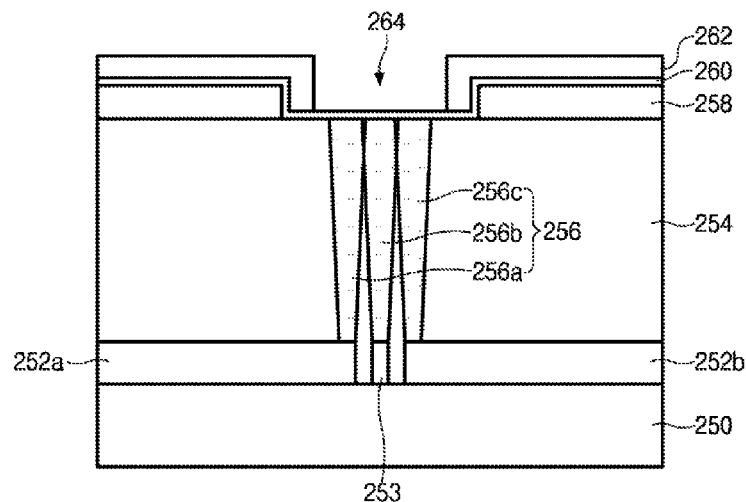

FIGS. 5A to 5C are cross-sectional views illustrating a method for forming a fuse of the semiconductor device according to a second embodiment of the present invention.

Referring to FIG. 5A, first and second metal lines 252a, 252b and a dummy line 253 are formed over the semiconductor substrate 250. The dummy line 253 may be formed of a metal. In an embodiment, the first and the second metal lines 252a, 252b and the dummy line 253 are spaced apart from each other. A voltage (Vss or Vdd) required for the fuse operation may be applied to the first metal line 252a and the second metal line 252b. The dummy line 253 may protect an underlying layer.

Subsequently, an interlayer insulation film 254 is formed over the semiconductor substrate 250 including the first and the second metal lines 252a, 252b and the dummy line 253. Thereafter, the interlayer insulation film 254 is etched to expose the first and the second metal lines 252a, 252b and the dummy line 253, such that a plurality of metal contact holes are formed. Preferably, upper portions of the metal contact holes overlap with other each.

Subsequently, a metal material fills the metal contact holes such that a first metal contact 256a, a second metal contact 256b, a third metal contact 256c are formed. A contact fuses 256 comprises the three metal contacts 256a, 256b, 256c. Preferably, an upper portion of the metal second contact 256b is coupled to upper portions of the first metal contact 256a and the third metal contact 256c and a lower portion of the second metal contact 256b is spaced apart from lower portions of the first metal contact 256a and the third metal contact 256c. In addition, the first metal contact 256a, the second metal contact 256b, the third metal contact 256c may be arranged in an inverted triangle configuration. Although not shown in FIGS. 5A-5C, the contact fuses 256 may be arranged in a linear manner or in a zigzag manner with respect to neighboring contact fuses.

Referring to FIG. 5B, an insulation film pattern 258 is formed over the contact fuses 256. Subsequently, a damascene insulation film 260 is formed, and an insulation film 262 is formed over the damascene insulation film 260. In an embodiment, the damascene insulation film 260 may include a nitride film.

Referring to FIG. 5C, a fuse-open region 264 is formed by etching the insulation film 262. Although not shown in the drawing, the blowing process for blowing the contact fuses 256 by applying a laser spot to the fuse-open region 264 may further be executed in a subsequent process.

As described above, the fuse of the semiconductor device and the method for manufacturing the same have the following advantages. A contact fuse of a semiconductor device according to an embodiment of the present invention includes a metal contact and a contact fuses. An upper portion of the contact fuses overlaps with an upper portion of the metal contact, and a lower portion of the contact fuses is spaced apart from a lower portion of the metal contact. In addition, when applying a laser spot to the metal fuse of the semiconductor device, upper portions of the metal contact and the contact fuses are blown, while an interlayer insulation film between the lower portion of the metal contacts and the lower portion of the contact fuses remain to separate the lower portion of the metal contact and the lower portion of the contact fuses. The metal fuse may be in an inverted triangle configuration so that the metal fuse can be easily cut or severed even by a small spot of laser spot, thus preventing neighboring metal fuses from being damaged or lost.

Since the contact fuses is in the form of contact, oxidation of the fuse and migration of material forming the fuse can be significantly reduced compared to a contact fuses is in the form of a metal line. In addition, a conventional contact fabrication process may be applied to an embodiment of the present invention without any change, so that mass production of semiconductor devices is possible. Furthermore, the fuse region is reduced in size, resulting in reduction in production costs.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and variations falling within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A fuse for a semiconductor device comprising:
 a first metal line formed over a semiconductor substrate, and a second metal line spaced apart from the first metal line, and a dummy line disposed between the first metal line and the second metal line; and
 contact fuses including metal contacts coupled to the first metal line and the second metal line, each of the metal contacts having an upper portion with a first width and a lower portion with a second width that is less than the first width,
 wherein the upper portions of the contact fuses overlap with each other, and the lower portions are spaced apart from each other, and
 wherein the upper portions of neighboring metal contacts are in physical contact with each other, and the lower portions of neighboring metal contacts are insulated from each other.

2. The fuse according to claim 1, wherein the contact fuses are comprised of at least two metal contacts.

3. The fuse according to claim 1, wherein the contact fuses includes at least three metal contacts, and wherein the upper portions of the metal contacts overlap with each other and are arranged in a triangle configuration.

4. The fuse according to claim 1, wherein the metal contact is formed of any one of tungsten (W), titanium (Ti), titanium nitride (TiN), copper (Cu), tantalum (Ta), tantalum nitride (TaN), silicon (Si), and cobalt (Co).

5. The fuse according to claim 1, wherein each of the contact fuses are spaced apart from neighboring contact fuses and arranged in a linear manner with respect to neighboring contact fuses.

6. The semiconductor device according to claim 1, wherein each of the contact fuses is spaced apart from neighboring contact fuses and arranged in a zigzag manner with respect to neighboring contact fuses.

7. The fuse according to claim 1, wherein the first metal line is configured to receive a voltage for operating the contact fuses as an input.

8. The fuse according to claim 1, wherein the dummy line is used as an etch stop film.

9. The semiconductor device of claim 1, wherein a first corner of the second metal contact is in physical contact with a corner of the first metal contact, and a second corner of the second metal contact is in physical contact with a corner of the third metal contact.

10. A semiconductor device comprising:
contact fuses comprising a first metal contact, a second metal contact and a third metal contact, each of the first, second, and third metal contacts including an upper portion with a first width and a lower portion with a second width that is less than the first width;
first and second metal lines coupled to the first and the third metal contacts, respectively; and
a dummy line coupled to the second metal contact and insulated from the first and the second metal lines,
wherein the second metal contact extends vertically from the dummy line, and
wherein the upper portion of the second metal contact is in physical contact with the upper portions of the first and third metal contacts, and the lower portions of the first, second, and third metal contacts are insulated from one another.

11. The a semiconductor device of claim 10, wherein the second metal contact is arranged in a triangle configuration with respect to the first metal contact and the third metal contact.

12. The a semiconductor device of claim 10, wherein the contact fuses are arranged in a linear manner or in a zigzag manner with respect to neighboring contact fuses.

13. The semiconductor device of claim 10,
wherein an upper portion of the second metal contact is coupled to upper portions of the first and the third metal contacts, respectively, and
wherein a lower portion of the second metal contact is insulated from lower portions of the first and the third metal contacts, respectively.

14. The semiconductor device of claim 10, wherein an upper surface of the first metal line and an upper surface of the dummy line are disposed at a first level,
wherein upper surfaces of the first, second and third metal contacts are disposed at a second level higher than the first level.

15. A semiconductor device comprising:
contact fuses comprising a first metal contact, a second metal contact and a third metal contact;
wherein an upper portion of the second metal contact is in physical contact with upper portions of the first and the third metal contacts, respectively,
wherein a lower portion of the second metal contact is insulated from lower portions of the first and the third metal contacts, respectively, and
wherein the upper portions of the first, second and third metal contacts have a first width, and the lower portions of the first, second, and third metal contacts have a second width that is less than the first width.

16. The semiconductor device of claim 15, the device further comprising:
first and second metal lines coupled to lower portions of the first and the third metal contacts, respectively, and
a dummy line coupled to a lower portion of the second metal contact and insulated from the first and the second metal lines, respectively.

17. The semiconductor device of claim 15, wherein a first side of the first metal contact is aligned with a first side of the third metal contact, a second side of the first metal contact opposing the first side of the first metal contact is aligned with a second side of the third metal contact, and first and second opposing sides of the second metal contact are offset from the first and second sides of the first and third metal contacts.

* * * * *